(12) United States Patent
Ryoo et al.

(10) Patent No.: US 10,943,962 B2
(45) Date of Patent: Mar. 9, 2021

(54) ELECTROLUMINESCENCE DISPLAY APPARATUS

(71) Applicant: LG Display Co., Ltd., Seoul (KR)

(72) Inventors: TaeKung Ryoo, Paju-si (KR); Kyoungji Bae, Paju-si (KR); Hyuk-Chan Gee, Paju-si (KR); Jinah Kwak, Paju-si (KR); Sejin Kim, Paju-si (KR); Sungmoo Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/216,209

(22) Filed: Dec. 11, 2018

(65) Prior Publication Data
US 2019/0189711 A1    Jun. 20, 2019

(30) Foreign Application Priority Data

Dec. 14, 2017 (KR) .......... 10-2017-0172532

(51) Int. Cl.
*H01L 27/32* (2006.01)
*H01L 51/52* (2006.01)
*H01L 51/50* (2006.01)
*H01L 51/00* (2006.01)

(52) U.S. Cl.
CPC ...... *H01L 27/3246* (2013.01); *H01L 51/0005* (2013.01); *H01L 51/5036* (2013.01); *H01L 51/5206* (2013.01); *H01L 51/5221* (2013.01); *H01L 27/3223* (2013.01)

(58) Field of Classification Search
CPC ............. H01L 27/3246; H01L 27/3223; H01L 27/3283
See application file for complete search history.

(56) References Cited

U.S. PATENT DOCUMENTS

| 8,895,438 B2 * | 11/2014 | Peter ............... G03F 7/0002 264/293 |
| 9,305,983 B2 | 4/2016 | Kim et al. |
| 10,079,272 B2 * | 9/2018 | Song ............... H01L 27/3246 |
| 2004/0201048 A1 | 10/2004 | Seki et al. |

(Continued)

FOREIGN PATENT DOCUMENTS

| CN | 1832646 A | 9/2006 |
| CN | 101005124 A | 7/2007 |

(Continued)

OTHER PUBLICATIONS

Communication dated May 28, 2019, from the European Patent Office in counterpart European Application No. 18211646.7.

(Continued)

*Primary Examiner* — Mariceli Santiago
(74) *Attorney, Agent, or Firm* — Morgan, Lewis & Bockius LLP

(57) ABSTRACT

Disclosed is an electroluminescence display apparatus. The electroluminescence display apparatus includes a substrate, a bank provided to define a plurality of emission areas on the substrate, and a first light emitting layer provided in a first emission area of the plurality of emission areas, and a second light emitting layer provided in a second emission area of the plurality of emission areas. An anti-spread part is provided on an upper surface of the bank disposed between the first light emitting layer and the second light emitting layer.

19 Claims, 9 Drawing Sheets

(56) References Cited

U.S. PATENT DOCUMENTS

| | | | |
|---|---|---|---|
| 2005/0112341 A1* | 5/2005 | Ito | H01L 27/3246 428/209 |
| 2005/0140274 A1* | 6/2005 | Lee | H01L 27/3246 313/504 |
| 2010/0062147 A1* | 3/2010 | Kinoshita | H01L 51/0005 427/58 |
| 2010/0165269 A1* | 7/2010 | Nara | H01L 51/56 349/106 |
| 2010/0291723 A1* | 11/2010 | Low | H01L 27/3246 438/46 |
| 2011/0221741 A1 | 9/2011 | Kawamura et al. | |
| 2012/0049210 A1 | 3/2012 | Takagi | |
| 2013/0099221 A1* | 4/2013 | Kawamura | H01L 27/3246 257/40 |
| 2014/0131684 A1* | 5/2014 | Prakash | H01L 27/3246 257/40 |
| 2015/0044805 A1* | 2/2015 | Ishino | H01L 27/3246 438/46 |
| 2015/0372067 A1 | 12/2015 | Kim | |
| 2016/0056219 A1* | 2/2016 | Kim | H01L 27/3246 257/40 |
| 2016/0079323 A1 | 3/2016 | Choi et al. | |
| 2016/0181335 A1* | 6/2016 | Mori | H01L 51/0004 257/40 |
| 2017/0279049 A1* | 9/2017 | Dai | H01L 51/56 |
| 2018/0090682 A1* | 3/2018 | Shi | H01L 27/3283 |
| 2019/0051712 A1* | 2/2019 | Yu | H01L 27/3246 |

FOREIGN PATENT DOCUMENTS

| | | |
|---|---|---|
| CN | 101849281 A | 9/2010 |
| CN | 105590957 A | 5/2016 |
| CN | 105774279 A | 7/2016 |
| EP | 0 989 778 A1 | 3/2000 |
| EP | 2 819 173 A1 | 12/2014 |
| KR | 10-2016-0029243 A | 3/2016 |
| TW | 201033653 A | 9/2010 |
| WO | 2009/029045 A1 | 3/2009 |
| WO | 2012/017498 A1 | 2/2012 |
| WO | 2015/152085 A1 | 10/2015 |

OTHER PUBLICATIONS

Communication dated Sep. 25, 2019, from the European Patent Office in counterpart European Application No. 18211646.7.

Office Action dated Aug. 26, 2019, from the Taiwanese Patent Office in counterpart Taiwan Application No. 107143970.

First Notification of Office Action dated Oct. 10, 2020, issued in corresponding Chinese Patent Application No. 201811493536.6.

* cited by examiner

ELECTROLUMINESCENCE DISPLAY APPARATUS

This application claims the benefit of Korean Patent App. No. 10-2017-0172532, filed Dec. 14, 2017, which is hereby incorporated by reference.

BACKGROUND

Technical Field

The present disclosure relates to an electroluminescence display apparatus, and more particularly, to an electroluminescence display apparatus manufactured through a solution process.

Discussion of the Related Art

Electroluminescence display apparatuses are apparatuses where a light emitting layer is provided between two electrodes and emits light with an electric field between the two electrodes, thereby displaying an image.

The light emitting layer may be formed of an organic material or an inorganic material such as a quantum dot. In the light emitting layer, an exciton is generated by a combination of an electron and a hole, and when the exciton is shifted from an excited state to a ground state, light is emitted.

Hereinafter, a related art electroluminescence display apparatus will be described with reference to the drawing.

FIG. 1 is a schematic cross-sectional view of a related art electroluminescence display apparatus.

As seen in FIG. 1, the related art electroluminescence display apparatus includes a substrate 10, a circuit element layer 20, a first electrode 30, a bank 40, and a light emitting layer 50.

The circuit element layer 20 is provided on the substrate 10. Various signal lines, a thin film transistor (TFT), and a capacitor are provided on the circuit element layer 20.

The first electrode 30 is provided on the circuit element layer 20. The first electrode 30 is patterned in each of a plurality of pixels and acts as an anode of the related art electroluminescence display apparatus.

The bank 40 is provided in a matrix structure to define a plurality of emission areas.

The light emitting layer 50 is provided in each of the plurality of emission areas defined by the bank 40. The light emitting layer 50 is formed in each of the plurality of emission areas through a solution process using an inkjet apparatus.

In the related art electroluminescence display apparatus, when the light emitting layer 50 is formed through the solution process, the light emitting layer 50 provided in one of the plurality of emission areas spreads to another emission area adjacent thereto and is mixed with the light emitting layer 50 provided in the neighboring emission area, and due to this, it is difficult to realize a high-quality image.

SUMMARY

Accordingly, embodiments of the present disclosure are directed to an electroluminescence display apparatus that substantially obviates one or more problems due to limitations and disadvantages of the related art.

An aspect of the present disclosure is to provide an electroluminescence display apparatus in which light emitting layers respectively provided in emission areas adjacent to one another are prevented from being mixed with one another, and thus, enhance image quality.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, an electroluminescence display apparatus is provided.

In an example, there is provided an electroluminescence display apparatus comprising a substrate, a bank provided to define a plurality of first emission areas, a plurality of second emission areas, and a plurality of third emission areas on the substrate, a plurality of first light emitting layers respectively provided in the plurality of first emission areas, a plurality of second light emitting layers respectively provided in the plurality of second emission areas, a plurality of third light emitting layers respectively provided in the plurality of third emission areas, a first anti-spread part extending on an upper surface of the bank along a boundary surface between the plurality of first light emitting layers and the plurality of second light emitting layers, and a second anti-spread part extending on the upper surface of the bank along a boundary surface between the plurality of second light emitting layers and the plurality of third light emitting layers.

In another example, there is provided an electroluminescence display apparatus comprising a substrate including an active area and a dummy area provided outside the active area, a bank defining a plurality of emission areas in the active area on the substrate and defining a plurality of dummy sub-areas in the dummy area on the substrate, a plurality of first light emitting layers and a plurality of second light emitting layers individually provided in the plurality of emission areas, a plurality of first dummy layers and a plurality of second dummy layers individually provided in the plurality of dummy sub-areas, and an anti-spread part extending on an upper surface of the bank along a boundary surface between the plurality of first light emitting layers and the plurality of second light emitting layers.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate examples of the disclosure and together with the description serve to explain various principles of the disclosure. In the drawings.

DETAILED DESCRIPTION

Figure 1:
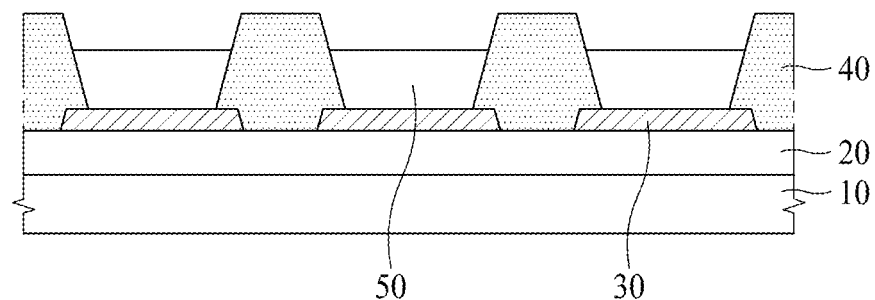
FIG. 1 is a schematic cross-sectional view of a related art electroluminescence display apparatus.

Reference will now be made in detail to embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following examples described with reference to the accompanying drawings. The present disclosure may, however, be embodied in different forms and should not be construed as limited to the examples set forth herein. Rather, these examples are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing examples of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various examples of the present disclosure may be partially or overall coupled to or combined with each other, and may be variously inter-operated with each other and driven technically as those skilled in the art can sufficiently understand. The examples of the present disclosure may be carried out independently from each other, or may be carried out together in co-dependent relationship.

Hereinafter, exemplary examples of the present disclosure will be described in detail with reference to the accompanying drawings.

Figure 2:
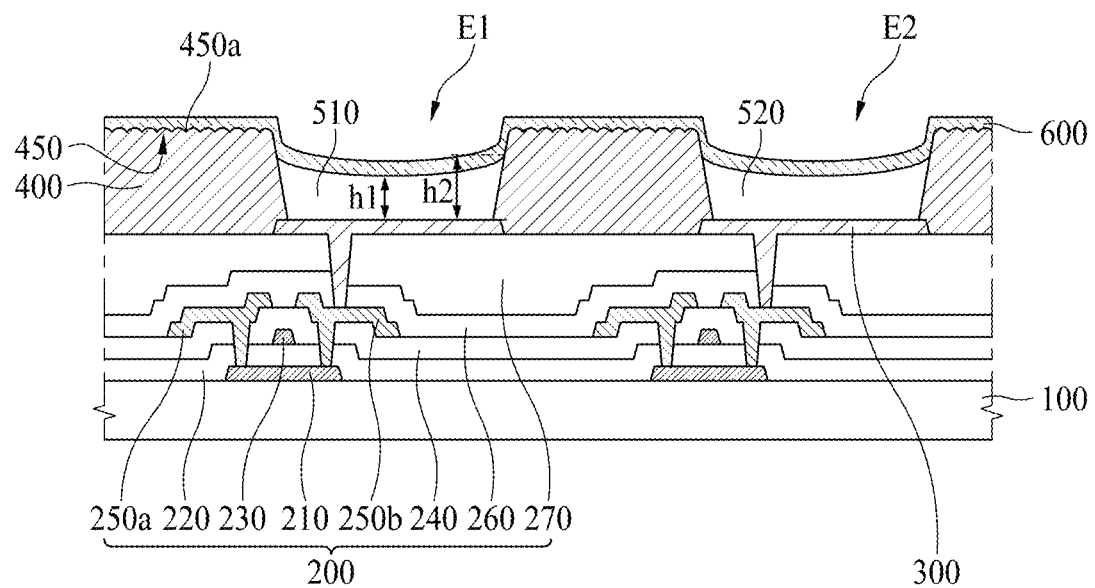
FIG. 2 is a schematic cross-sectional view of an electroluminescence display apparatus according to an example of the present disclosure.

FIG. 2 is a schematic cross-sectional view of an electroluminescence display apparatus according to an example of the present disclosure.

As seen in FIG. 2, the electroluminescence display apparatus according to an example of the present disclosure may include a substrate 100, a circuit element layer 200, a first electrode 300, a bank 400, a plurality of light emitting layers (for example, first and second light emitting layers) 510 and 520, and a second electrode 600.

The substrate 100 may be formed of glass, plastic, and/or the like, but is not limited thereto. The substrate 100 may be formed of a transparent material, or may be formed of an opaque material.

The electroluminescence display apparatus according to an example of the present disclosure may be implemented as a top emission type where emitted light travels to an upper portion, and in this case, a material of the substrate 100 may use an opaque material as well as a transparent material. Also, the electroluminescence display apparatus according to an example of the present disclosure may be implemented as a bottom emission type where emitted light travels to a lower portion, and in this case, the material of the substrate 100 may use a transparent material.

The circuit element layer 200 may be provided on the substrate 100.

The circuit element layer 200 may include an active layer 210, a gate insulation layer 220, a gate electrode 230, an interlayer insulation layer 240, a source electrode 250a, a drain electrode 250b, a passivation layer 260, and a planarization layer 270.

The active layer 210 may be provided on the substrate 100. The active layer 200 may be formed of a silicon-based semiconductor material, an oxide semiconductor material, and/or the like, but is not limited thereto. Although not shown, a light blocking layer may be further provided between the substrate 100 and the active layer 210 and may block the traveling of light to the active layer 210, thereby preventing the active layer 210 from being deteriorated.

The gate insulation layer 220 may be provided on the active layer 210 and may insulate the active layer 210 from the gate electrode 230.

The gate electrode 230 may be provided on the gate insulation layer 220.

The interlayer insulation layer 240 may be provided on the gate electrode 230 and may insulate the gate electrode 230 from the source/drain electrode 250a/250b.

The source electrode 250a and the drain electrode 250b may face each other and may be spaced apart from each other on the interlayer insulation layer 240. The source electrode 250a may be connected to one end of the active layer 210 through a contact hole which is provided in the interlayer insulation layer 240 and the gate insulation layer 220, and the drain electrode 250b may be connected to the other end of the active layer 210 through another contact hole which is provided in the interlayer insulation layer 240 and the gate insulation layer 220.

The passivation layer 260 may be provided on the source electrode 250a and the drain electrode 250b and may protect a thin film transistor (TFT).

The planarization layer 270 may be provided on the passivation layer 260 and may planarize an upper surface of the circuit element layer 200.

As described above, the circuit element layer 200 may include a TFT which includes the gate electrode 230, the active layer 210, the source electrode 250a, and the drain electrode 250b. In FIG. 2, a TFT having a top gate structure where the gate electrode 230 is provided on the active layer 210 is illustrated, but is not limited thereto. In other examples, the circuit element layer 200 may include a TFT having a bottom gate structure where the gate electrode 230 is provided under the active layer 210.

In the circuit element layer 200, a circuit element including various signal lines, TFTs, and a capacitor may be provided in each of a plurality of pixels. The signal lines may include a gate line, a data line, a power line, and a reference line, and the TFTs may include a switching TFT, a driving TFT, and a sensing TFT.

The switching TFT may be turned on by a gate signal supplied through the gate line and may transfer a data voltage, supplied through the data line, to the driving TFT.

The driving TFT may be turned on by the data voltage transferred from the switching TFT to generate a data current from a power supplied through the power line and may supply the data current to the first electrode 300.

The sensing TFT may sense a threshold voltage deviation of the driving TFT which causes the degradation in image quality. The sensing TFT may supply a current of the driving TFT to the reference line in response to a sensing control signal supplied through the gate line or a separate sensing line.

The capacitor may hold the data voltage supplied to the driving TFT during one frame and may be connected to a gate electrode and a source electrode of the driving TFT.

The first electrode 300 may be provided on the circuit element layer 200. The first electrode 300 may be patterned in each of the plurality of pixels and may act as an anode of the electroluminescence display apparatus.

When the electroluminescence display apparatus according to an example of the present disclosure is implemented as the top emission type, the first electrode 300 may include a reflective material for reflecting light, emitted from each of the light emitting layers 510 and 520, to an upper portion. In this case, the first electrode 300 may have a stacked structure including a transparent conductive material and the reflective material. On the other hand, when the electroluminescence display apparatus according to an example of the present disclosure is implemented as the bottom emission type, the first electrode 300 may include the transparent conductive material.

The first electrode 300 may be connected to the drain electrode 250b of the TFT through a contact hole which is provided in the planarization layer 270 and the passivation layer 260. Depending on the case, the first electrode 300 may be connected to the source electrode 250a of the TFT through a contact hole which is provided in the planarization layer 270 and the passivation layer 260.

The bank 400 may be provided in a matrix structure in a boundary between adjacent pixels of the plurality of pixels and may define a plurality of emission areas (for example, first and second emission areas) E1 and E2 for each of the plurality of pixels. That is, in each of the plurality of pixels, an opening where the bank 400 is not provided may be each of the emission areas E1 and E2.

The bank 400 may be provided on the circuit element layer 200 to cover both ends of the first electrode 300. Therefore, a plurality of first electrodes 300 respectively patterned in the plurality of pixels may be insulated from one another by the bank 400.

The bank 400 may be formed of an organic insulating material having hydrophilicity. In this case, the light emitting layers 510 and 520 may easily spread to a side surface of the bank 400 and may be uniformly provided in the emission areas E1 and E2, respectively.

When a whole portion of the bank 400 has hydrophilicity, the first light emitting layer 510 provided in the first emission area E1 may flow to the second emission area E2 via an upper surface of the bank 400 and may be mixed with the second light emitting layer 520. Therefore, in order to prevent the first light emitting layer 510 from being mixed with the second light emitting layer 520, the upper surface of the bank 400 may be configured to have an anti-spread part (450) having higher hydrophobicity than lower portion(s) of the bank. Accordingly, spread of the first light emitting layer 510 into the second emission area E2, and/or spread of the second light emitting layer 520 into the first emission area E1 may be prevented and/or reduced. To achieve hydrophobicity, an upper surface or upper portion of the bank 400 may be coated with a hydrophobic material such as fluorine.

In another embodiment, the bank 400 may be patterned through a photolithography process after coating a solution mixed with an organic insulating material having hydrophilicity and a hydrophobic material such as fluorine. The hydrophobic material such as fluorine may move to an upper portion of the bank 400 due to light which is irradiated in the photolithography process, and thus, the upper portion of the bank 400 may have hydrophobicity and the other portion may have hydrophilicity. In this case, the upper surface of the bank 400 may have hydrophobicity, and thus, a degree to which the first light emitting layer 510 and the second light emitting layer 520 spread to the upper surface of the bank 400 is reduced, thereby solving a problem where the first light emitting layer 510 is mixed with the second light emitting layer 520.

Moreover, according to an example of the present disclosure, an anti-spread part 450 may be included in the upper surface of the bank 400. The anti-spread part 450 may include a plurality of grooves 450a included in the upper surface of the bank 400. Since the plurality of grooves 450a are included in the upper surface of the bank 400, the first light emitting layer 510 provided in the first emission area E1 is prevented from spreading to the second emission area E2 adjacent thereto even when the first light emitting layer 510 flows to the upper surface of the bank 400.

The plurality of grooves 450a, as illustrated, may be provided in the whole upper surface of the bank 400 disposed between the first and second light emitting layers 510 and 520 adjacent to each other, but are not limited thereto. In other examples, the plurality of grooves 450a may be provided in only a portion of the upper surface of the bank 400 between the first and second light emitting layers 510 and 520 adjacent to each other.

The plurality of light emitting layers 510 and 520 may be provided on the first electrode 300. In detail, the plurality of light emitting layers 510 and 520 may be respectively provided in the plurality of emission areas E1 and E2 defined by the bank 400.

The plurality of light emitting layers 510 and 520 may include the first light emitting layer 510 provided in the first emission area E1 of a first pixel and the second light emitting layer 520 provided in the second emission area E2 of a second pixel. The first light emitting layer 510 may be one of a red light emitting layer, a green light emitting layer, and a blue light emitting layer, and the second light emitting layer 520 may be another light emitting layer of the red light emitting layer, the green light emitting layer, and the blue light emitting layer. That is, the first light emitting layer 510 and the second light emitting layer 520 may emit lights of different colors in different pixels.

The light emitting layers 510 and 520 may be respectively patterned in the emission areas E1 and E2 through an inkjet process without a mask. In this case, a solution for the light emitting layers 510 and 520 may be dried, and then, a height h1 of the light emitting layers 510 and 520 at a center of the emission area E1 (E2) may be lower than a height h2 of the light emitting layers 510 and 520 at an end/edge (in detail, an end contacting the bank 400) of the emission areas E1 and E2. Particularly, as illustrated, a profile where a height of the light emitting layers 510 and 520 is gradually reduced in a direction from the end of the emission areas E1 and E2 contacting the bank 400 to the center of the emission areas E1 and E2 may be obtained. Accordingly, a portion of the second electrode 600 provided on the light emitting layers 510 and 520 may also be provided to have a profile corresponding to a profile of the light emitting layers 510 and 520.

The light emitting layers 510 and 520 may each include at least one organic layer of a hole injecting layer (HIL), a hole transporting layer (HTL), an emitting material layer (EML), and an electron transporting layer (ETL).

The second electrode 600 may be provided on the light emitting layers 510 and 520 and may act as a cathode of the electroluminescence display apparatus. The second electrode 600 may extend over the bank 400 and/or extend over the light emitting layers 510 and 520. Moreover, the second electrode 600 may extend over the plurality of pixels and/or over a boundary between adjacent pixels of the plurality of pixels. Accordingly, the second electrode 600 may function as a common electrode which receives a common voltage applied to the plurality of pixels.

As described above, since the anti-spread part 450 including the plurality of grooves 450a is included in the upper surface of the bank 400, the second electrode 600 may contact the anti-spread part 450, and thus, a lower surface of the second electrode 600 may be filled into the plurality of grooves 450a. Also, the light emitting layers 510 and 520 may be discharged in a solution state, and then, may flow to the upper surface of the bank 400 and may contact the anti-spread part 450. In this case, the light emitting layers 510 and 520 may be filled into some of the plurality of grooves 450a, and the lower surface of the second electrode 600 may be filled into the other grooves 450a.

When the electroluminescence display apparatus according to an example of the present disclosure is implemented as the top emission type, the second electrode 600 may include a transparent conductive material for transmitting light, emitted from each of the light emitting layers 510 and 520, to an upper portion. On the other hand, when the electroluminescence display apparatus according to an example of the present disclosure is implemented as the bottom emission type, the second electrode 600 may include a reflective material for reflecting the light, emitted from each of the light emitting layers 510 and 520, to a lower portion.

Although not shown in detail, an encapsulation layer may be further provided on the second electrode 600. The encapsulation layer may prevent external water from penetrating into the light emitting layers 510 and 520. The encapsulation layer may be formed of an inorganic insulating material or may be formed in a structure where an inorganic insulating material and an organic insulating material are alternately stacked, but is not limited thereto.

Figure 3:
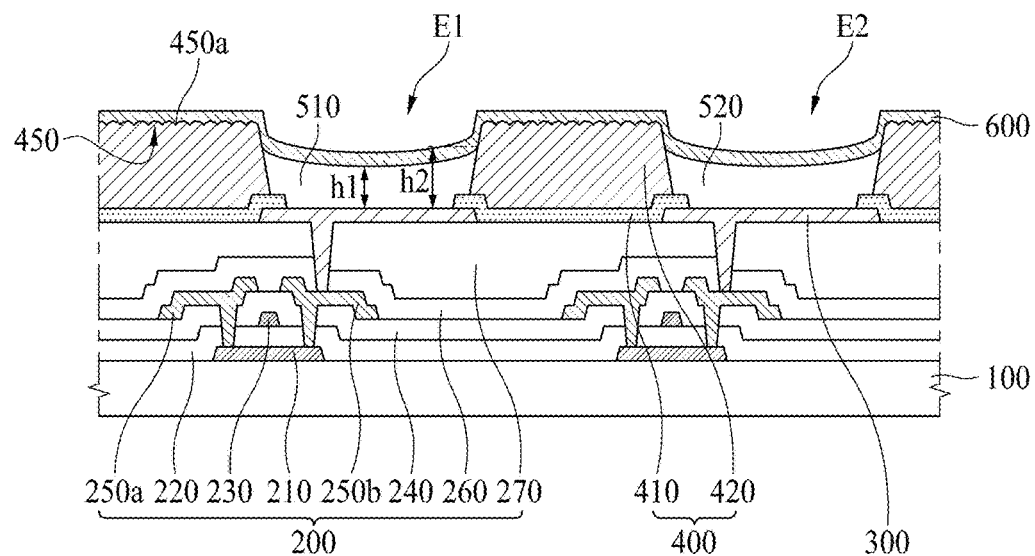
FIG. 3 is a schematic cross-sectional view of an electroluminescence display apparatus according to another example of the present disclosure.

FIG. 3 is a schematic cross-sectional view of an electroluminescence display apparatus according to another example of the present disclosure. Except for that a configuration of a bank 400 is modified, the electroluminescence display apparatus according to another example of the present disclosure is the same as the electroluminescence display apparatus of FIG. 2. Hereinafter, therefore, like reference numerals refer to like elements, and only different elements will be described.

Referring to FIG. 3, a bank 400 may include a first bank 410 and a second bank 420.

The first bank 410 may be provided on a circuit element layer 200 to cover an end of a first electrode 300. The first bank 410 may be provided to have a thickness thinner than that of the second bank 420 and a width wider than that of the second bank 420. The first bank 410 having such a structure may have the same hydrophilicity as that of each of a plurality of light emitting layers 510 and 520. The first bank 410 having hydrophilicity may be formed of an inorganic insulating material such as silicon oxide. Therefore, in a case where the light emitting layers 510 and 520 are formed through a solution process, a solution for forming the light emitting layers 510 and 520 may easily spread on the first bank 410.

The second bank 420 may be provided on the first bank 410. The second bank 420 may be provided to have a width which is narrower than that of the first bank 410. The second bank 420 may be patterned through a photolithography process after coating a solution mixed with an organic insulating material having hydrophilicity and a hydrophobic material such as fluorine. The hydrophobic material such as fluorine may move to an upper portion of the second bank 420 due to light which is irradiated in the photolithography process, and thus, the upper portion of the second bank 420 may have a higher hydrophobicity than the lower portion of the second bank 420. That is, a lower portion of the second bank 420 contacting the first bank 410 may have hydrophilicity, and the upper portion of the second bank 420 may have hydrophobicity. However, the present example is not limited thereto, and a whole portion of the second bank 420 may be provided to have hydrophobicity.

The spreading properties of a solution for forming the light emitting layers 510 and 520 are enhanced by the first bank 410 and the lower portion of the second bank 420, which have sufficient hydrophilicity to encourage spreading of the solution. By contrast the relative hydrophobicity of the upper portion of the second bank 420 suppresses spreading of the solution. Particularly, since the first bank 410 is provided to have a thickness thinner than that of the second bank 420 and a width wider than that of the second bank 420, a two-step structure having hydrophilicity may be provided by a combination of the first bank 410 and the second bank 420, and thus, the solution for forming the light emitting layers 510 and 520 may easily spread to left and right ends (as viewed in FIG. 3) of each of a plurality of emission areas E1 and E2.

Moreover, the upper portion of the second bank 420 having higher hydrophobicity than the first bank 410 and the lower portion of the second bank 420 prevents the solution for forming the light emitting layers 510 and 520 from spreading to other adjacent emission areas E1 and E2, thereby solving a problem where the light emitting layers 510 and 520 are mixed with each other between the adjacent emission areas E1 and E2. Also, an upper surface of the second bank 420 may have higher hydrophobicity than lower portions of the bank 400, and thus, even when the light emitting layers 510 and 520 flow out from the emission areas E1 and E2, the light emitting layers 510 and 520 are prevented from spreading to other adjacent emission areas E1 and E2.

Moreover, an anti-spread part 450 including a plurality of grooves 450a may be included in the upper surface of the second bank 420, and thus, the light emitting layers 510 and 520 respectively provided in the emission areas E1 and E2 are prevented from spreading to other adjacent emission areas E1 and E2.

Figure 4:
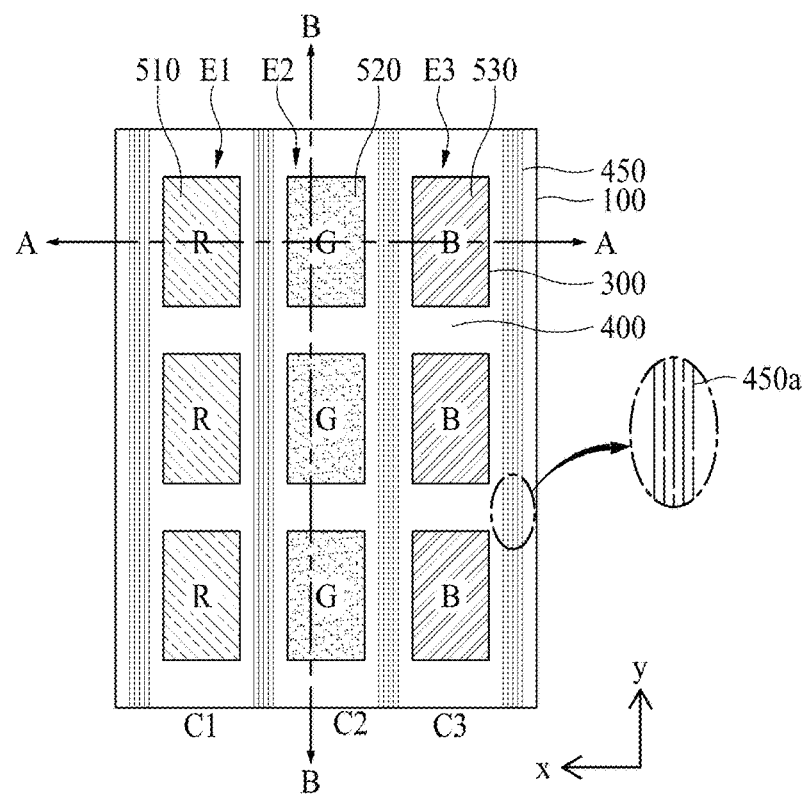
FIG. 4 is a schematic plan view of an electroluminescence display apparatus according to an example of the present disclosure.

FIG. 4 is a schematic plan view of an electroluminescence display apparatus according to an example of the present disclosure.

As seen in FIG. 4, the electroluminescence display apparatus according to an example of the present disclosure may include a substrate 100, a first electrode 300, a bank 400, and a plurality of light emitting layers 510, 520, and 530.

The first electrode 300 may be provided in each of a plurality of pixels on the substrate 100. Therefore, a plurality of first electrodes 300 may be arranged in a matrix structure and may be spaced apart from one another.

The bank 400 may be provided in a matrix structure in a boundary between adjacent pixels of the plurality of pixels, and a plurality of emission areas (for example, first to third emission areas) E1 to E3 may be defined by the bank 400. Therefore, one emission area may be provided in each of the plurality of pixels, and the first electrode 300 may be provided to correspond to each of the plurality of emission areas E1 to E3.

The plurality of light emitting layers 510, 520, and 530 may include a first light emitting layer 510 provided in the first emission area E1, a second light emitting layer 520 provided in the second emission area E2, and a third light emitting layer 530 provided in the third emission area E3. The first light emitting layer 510 may be provided to emit light of a first color (for example, red (R)), the second light emitting layer 520 may be provided to emit light of a second color (for example, green (G)), and the third light emitting layer 530 may be provided to emit light of a third color (for example, blue (B)).

The first light emitting layer 510, the second light emitting layer 520, and the third light emitting layer 530 may be arranged in plurality to respectively configure a plurality of columns C1 to C3. In detail, a plurality of first light emitting layers 510 may be arranged in one row to configure a first column C1, a plurality of second light emitting layers 520 may be arranged in one row to configure a second column C2, and a plurality of third light emitting layers 530 may be arranged in one row to configure a third column C3. Therefore, a plurality of first emission areas E1 may be arranged in one row to configure the first column C1, a plurality of second emission areas E2 may be arranged in one row to configure a second column C2, and a plurality of third emission areas E3 may be arranged in one row to configure a third column C3.

In the present disclosure, the plurality of first emitting layers 510 may be light emitting layers which emit lights of the same color (for example, red (R)), and the plurality of second light emitting layers 520 may be light emitting layers which emit lights of the same color (for example, green (G)) which differs from the first and third light emitting layers 510 and 530. Also, the plurality of third light emitting layers 530 may be light emitting layers which emit lights of the same color (for example, blue (B)) which differs from the first and second light emitting layers 510 and 520.

Therefore, a plurality of light emitting layers which emit lights of the same color may be arranged in the same column.

An anti-spread part 450 may be provided on an upper surface of the bank 400.

The anti-spread part 450 may be provided between adjacent columns. The anti-spread part 450 may be provided between the first column C1 and the second column C2, between the second column C2 and the third column C3, between the first column C1 and a left column (not shown) of the first column C1, and between the third column C3 and a right column (not shown) of the third column C3. Therefore, the anti-spread part 450 may extend in an extension direction (a y-axis direction) of each of the columns C1 to C3 along a boundary surface between the first light emitting layer 510 of the first column C1 and the second light emitting layer 520 of the second column C2 and may extend in the extension direction (the y-axis direction) of each of the columns C1 to C3 along a boundary surface between the second light emitting layer 520 and the third light emitting layer 530.

In this manner, since the anti-spread part 450 is provided between adjacent columns of the plurality of columns C1 to C3, the first light emitting layer 510 provided in the first emission area E1 of the first column C1 is prevented from spreading to the second emission area E2 of the second column C2, and thus, the first light emitting layer 510 is not mixed with the second light emitting layer 520.

The anti-spread part 450 may not be provided between a plurality of light emitting layers provided in the same column. In detail, the anti-spread part 450 may not be provided between the plurality of first light emitting layers 510 of the first column C1, between the plurality of second light emitting layers 520 of the second column C2, and between the plurality of third light emitting layers 510 of the third column C3.

Since the plurality of first light emitting layers 510 emit lights of the same color, image quality is not degraded even when the plurality of first light emitting layers 510 are mixed with one another. For this reason, the anti-spread part 450 may not be provided (i.e. may be omitted) between the plurality of first light emitting layers 510 of the first column C1. For the same reason, the anti-spread part 450 may not be provided between the plurality of second light emitting layers 520 of the second column C2 and between the plurality of third light emitting layers 510 of the third column C3.

As a result, the anti-spread part 450 may be provided in a continuous structure in the extension direction (the y-axis direction) of each of the plurality of columns C1 to C3. However, the present example is not limited thereto. In other examples, the anti-spread part 450 may be further provided between a plurality of light emitting layers provided in the same column. That is, the anti-spread part 450 may also be provided between the plurality of first light emitting layers 510 of the first column C1, between the plurality of second light emitting layers 520 of the second column C2, and between the plurality of third light emitting layers 510 of the third column C3.

The anti-spread part 450 may include a plurality of grooves 450a.

The plurality of grooves 450a may be spaced apart from one another and may be arranged in a vertical (or perpendicular) direction (an x-axis direction) to the extension direction (the y-axis direction) of each of the plurality of columns C1 to C3, and thus, when the light emitting layers 510, 520, and 530 are discharged and spread in a solution state, the plurality of grooves 450a may prevent the spread of the light emitting layers 510, 520, and 530.

The plurality of grooves 450a may extend in the extension direction (the y-axis direction) of each of the columns C1 to C3. That is, the plurality of grooves 450a may extend in the extension direction (the y-axis direction) of each of the columns C1 to C3 along a boundary surface between the first light emitting layer 510 of the first column C1 and the second light emitting layer 520 of the second column C2 and may extend in the extension direction (the y-axis direction) of each of the columns C1 to C3 along a boundary surface between the second light emitting layer 520 and the third light emitting layer 530.

In this case, some of the plurality of grooves 450a may be provided in a discontinuous structure in the extension direction (the y-axis direction) of each of the columns C1 to C3. The some grooves 450a provided in the discontinuous structure may overlap the other grooves 450a in a direction (the x-axis direction) vertical (or perpendicular) to the extension direction (the y-axis direction) of each of the columns C1 to C3. Therefore, although the some grooves 450a are provided in the discontinuous structure in the extension direction (the y-axis direction) of each of the columns C1 to C3, since the some grooves 450a provided in the discontinuous structure overlap the other grooves 450a in the direction (the x-axis direction) vertical (or perpendicular) to the extension direction (the y-axis direction) of each of the columns C1 to C3, each of the plurality of light emitting layers 510, 520, and 530 does not easily spread to an adjacent emission area of the plurality of emission areas E1 to E3.

The plurality of grooves 450a may be formed through a process of irradiating a laser beam onto an upper surface of the bank 400. In detail, when the laser beam is irradiated onto the upper surface of the bank 400 in the extension direction (the y-axis direction) of each of the columns C1 to C3 in an area between adjacent columns of the columns C1 to C3, the anti-spread part 450 may be configured by a combination of the plurality of grooves 450a as described above.

An upper surface of a stacked structure is difficult to configure a completely flat surface, and an upper surface of each of most stacked structures has a certain roughness. Likewise, the upper surface of the bank 400 may not be completely flat. When a laser beam is irradiated onto the non-flat upper surface of the bank 400, a portion of the irradiated laser beam may be scattered in the upper surface of the bank 400. Therefore, periodic interference occurs between the irradiated laser beam and the scattered laser beam, and due to the periodic interference, melting and recrystallization may be performed on the upper surface of the bank 400, whereby the plurality of grooves 450a may be formed in the upper surface of the bank 400. The plurality of grooves 450a may extend in a traveling direction of the laser beam, and particularly, may not be continuously provided from a start point to an end point of the laser beam and may be intermittently disconnected. Accordingly, when the laser beam is irradiated in a scan manner in the extension direction (the y-axis direction) of each of the columns C1 to C3 in the area between adjacent columns of the columns C1 to C3, the plurality of grooves 450a may be formed to have a discontinuous structure in the extension direction of each of the columns C1 to C3 and to overlap one another in a direction vertical (or perpendicular) to the extension direction of each of the columns C1 to C3.

The irradiation of the laser beam may be performed without a mask, or may be performed in a state where a region other than a region occupied by the anti-spread part 450 is hidden by a mask. The irradiation of the laser beam may be performed by using a laser irradiation apparatus including a laser source, a reflecting mirror, and a lens.

Figure 11:
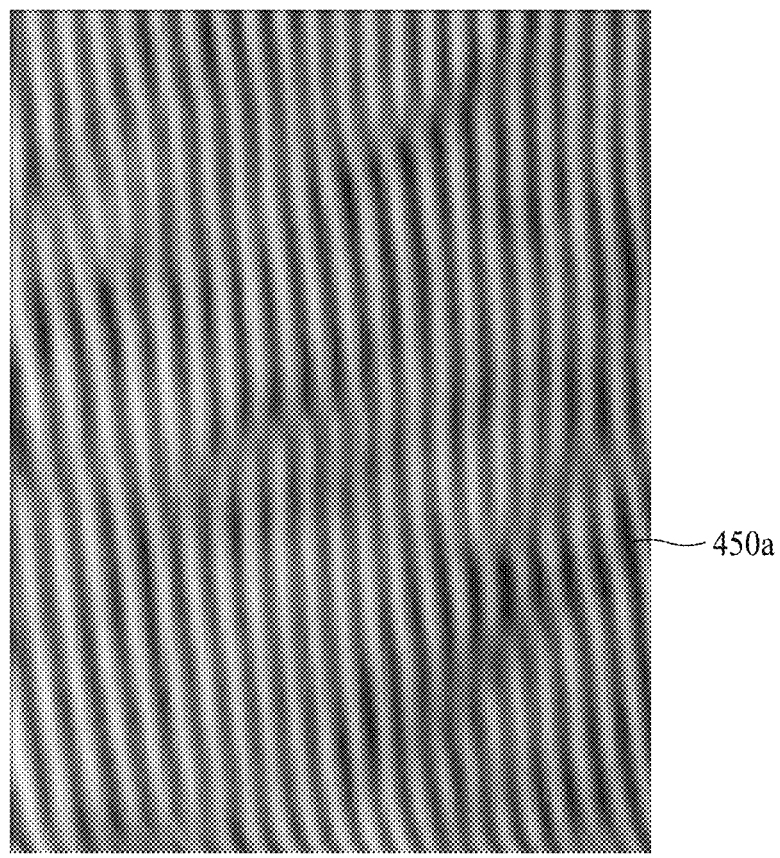
FIG. 11 is a photograph showing shapes of a plurality of grooves formed by irradiating a laser beam onto an upper surface of a bank according to an example of the present disclosure.

FIG. 11 is a photograph showing shapes of the plurality of grooves 450a formed by irradiating a laser beam onto the upper surface of the bank 400 according to an example of the present disclosure. In FIG. 11, relatively dark regions are regions where the plurality of grooves 450a are provided. As seen in FIG. 11, it may be seen that some grooves 450a discontinuously extend in a lengthwise direction which is a laser irradiation direction, and discontinuous grooves 450a overlap one another in a widthwise direction vertical to the laser irradiation direction.

Figure 5A:
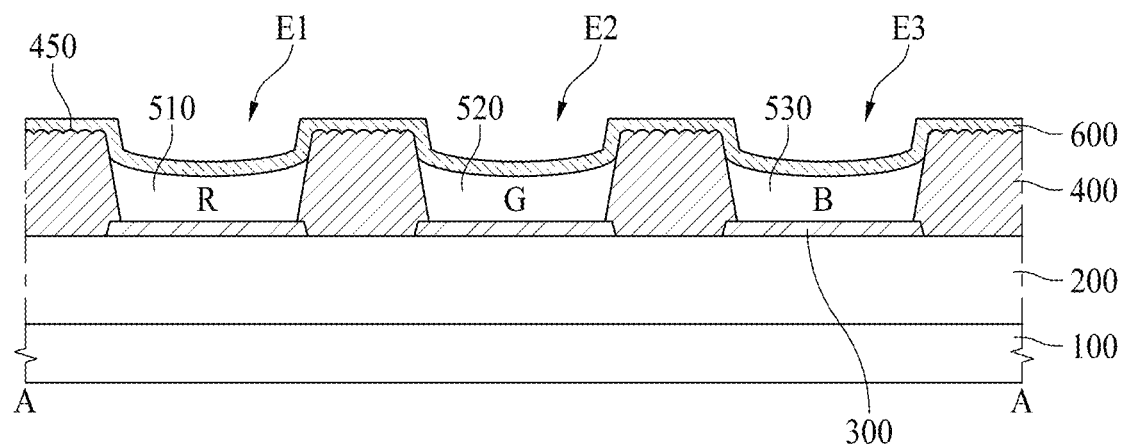
FIG. 5A is a schematic cross-sectional view taken along line A-A of FIG. 4.

FIG. 5A is a schematic cross-sectional view taken along line A-A of FIG. 4 and is a schematic cross-sectional view taken along a line crossing the light emitting layers 510, 520, and 530 of the respective columns C1 to C3 which differ.

As seen in FIG. 5A, a circuit element layer 200 may be provided on a substrate 100, and a first electrode 300 may be provided on the circuit element layer 200. Also, a bank 400 may be provided to cover an end of the first electrode 300 and to define a plurality of emission areas E1 to E3, and a plurality of light emitting layers (for example, first to third light emitting layers) 510, 520, and 530 may be respectively provided in the plurality of emission areas E1 to E3. Also, a second electrode 600 may be provided on the plurality of light emitting layers 510, 520, and 530.

An anti-spread part 450 including a plurality of grooves 450a may be provided on an upper surface of the bank 400 which corresponds to a space between the first and second light emitting layer 510 and 520 emitting lights of different colors and a space between the second and third light emitting layers 520 and 530 emitting lights of different colors.

Therefore, the anti-spread part 450 prevents a light emitting layer provided in one of the plurality of emission areas E1 to E3 from spreading to another emission area adjacent to the one emission area.

Figure 5B:
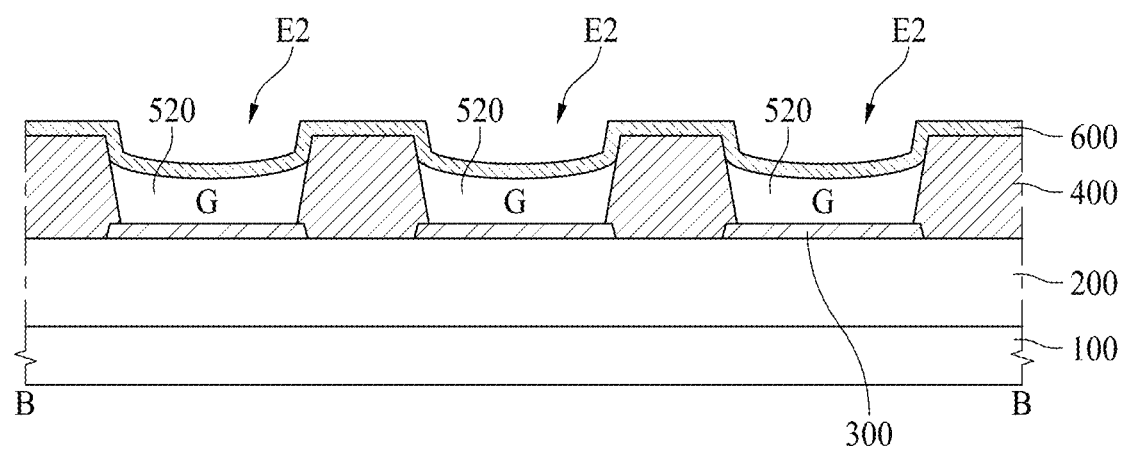
FIG. 5B is a schematic cross-sectional view taken along line B-B of FIG. 4.

FIG. 5B is a schematic cross-sectional view taken along line B-B of FIG. 4 and is a schematic cross-sectional view taken along a line crossing the plurality of second light emitting layers 520 arranged in the same column (for example, the second column C2).

Figure 5C:
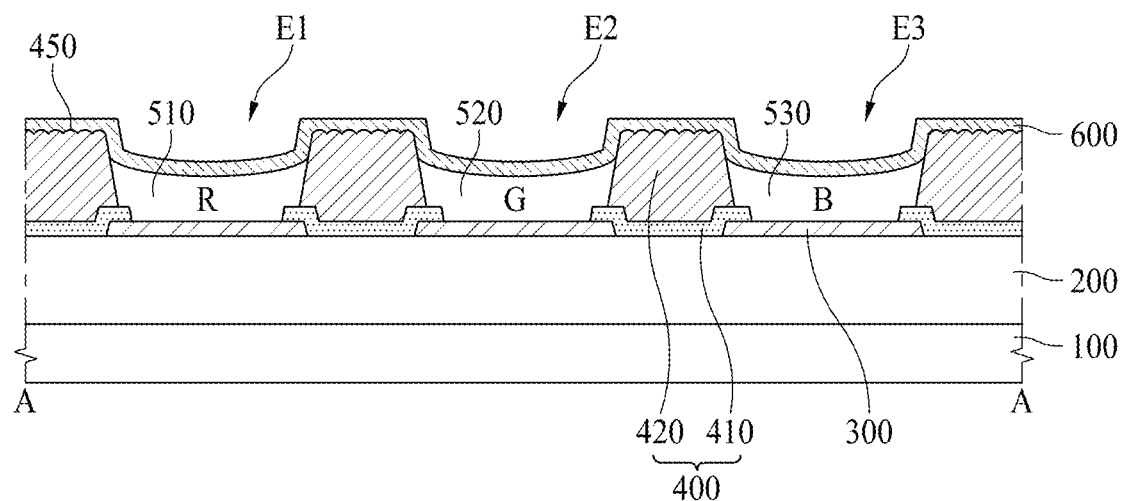
FIG. 5C is a schematic cross-sectional view similar to that of FIG. 5A, showing a first bank and a second bank between adjacent light emitting areas.

FIG. 5C is a variation of FIG. 5A, in which the bank 400 provided between the first emission area E1 and the second emission area E2, and between the second emission area E2 and the third emission area E3, is split into a first bank 410 and a second bank 420 provided on the first bank 410. As shown, the first bank may be provided to have a thickness that is thinner than that of the second bank 420, and a width that is wider than that of the second bank 420. The first bank 410 and a lower part of the second bank 420 may have a lower hydrophobicity than an upper portion of the second bank.

As seen in FIG. 5B, a circuit element layer 200 may be provided on a substrate 100, and a first electrode 300 may be provided on the circuit element layer 200. Also, a bank 400 may be provided to cover an end of the first electrode 300 and to define a plurality of second emission areas E2, and a plurality of second light emitting layers 520 may be respectively provided in the plurality of second emission areas E2. Also, a second electrode 600 may be provided on the plurality of second light emitting layers 520.

An anti-spread part 450 may not be provided in an upper surface of the bank 400 corresponding to a space between one second light emitting layer 520 and another second light emitting layer 520, which are adjacent to each other and emit lights of the same color.

Since the one second light emitting layer 520 and the other second light emitting layer 520 emit the lights of the same color, image quality is not degraded even when the one second light emitting layer 520 is mixed with the other second light emitting layer 520. However, the present example is not limited thereto. In other examples, the anti-spread part 450 may be provided in the upper surface of the bank 400 corresponding to a space between one second light emitting layer 520 and another second light emitting layer 520, which are adjacent to each other and emit lights of the same color.

Figure 5D:
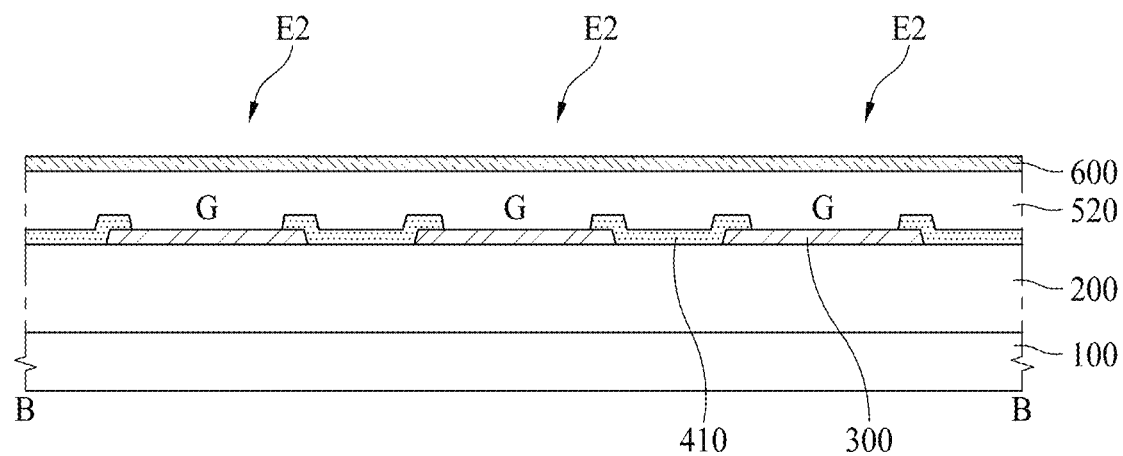
FIG. 5D is a schematic cross-sectional view similar to that of FIG. 5B, showing only a first bank between adjacent light emitting areas.

FIG. 5D is a variation on FIG. 5B, in which only a first bank 410 is provided between the adjacent second emission areas E2. The second bank 420 of FIG. 5C is not provided between the adjacent second emission areas D2. Because the adjacent second emission areas D2 shown in FIG. 5B each emit light of the same color (e.g. green light), there is less need to prevent spread of light between the adjacent second emission areas E2.

Figure 6:
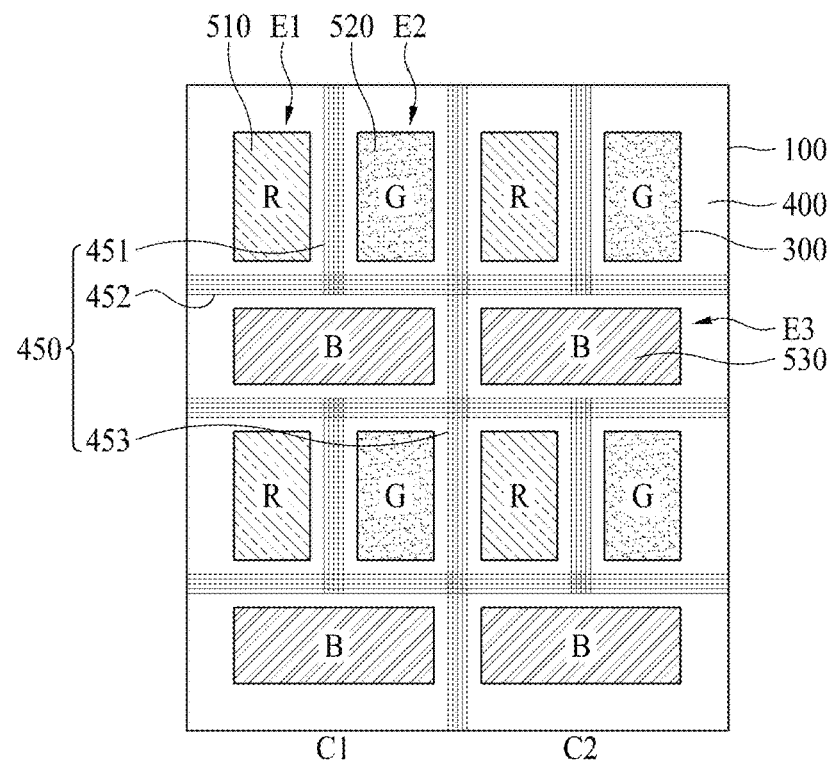
FIGS. 6 to 8 are schematic plan views of electroluminescence display apparatuses according to various examples of the present disclosure.
Figure 7:
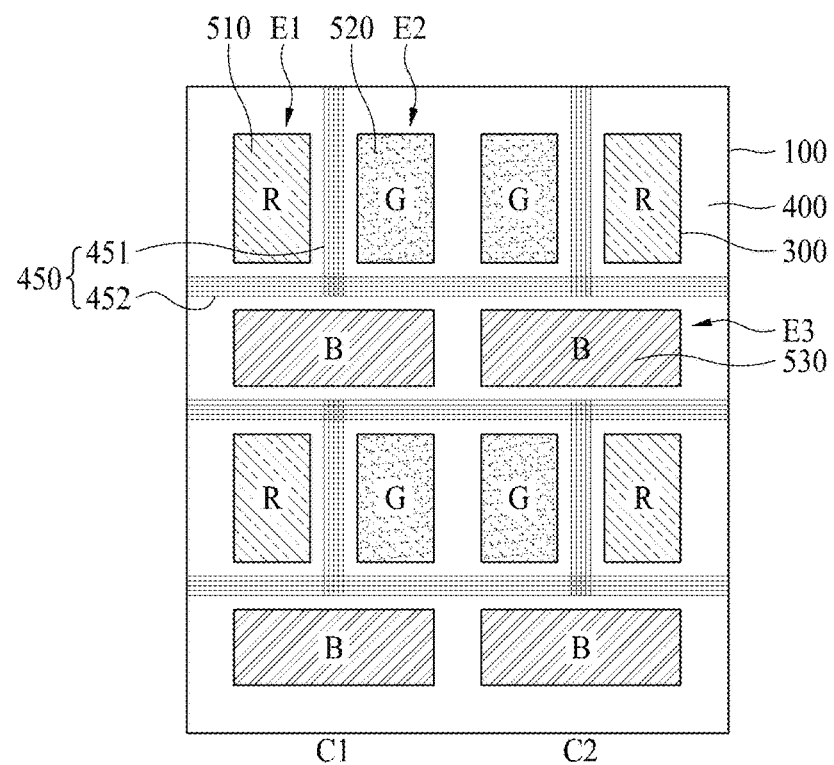
Figure 8:
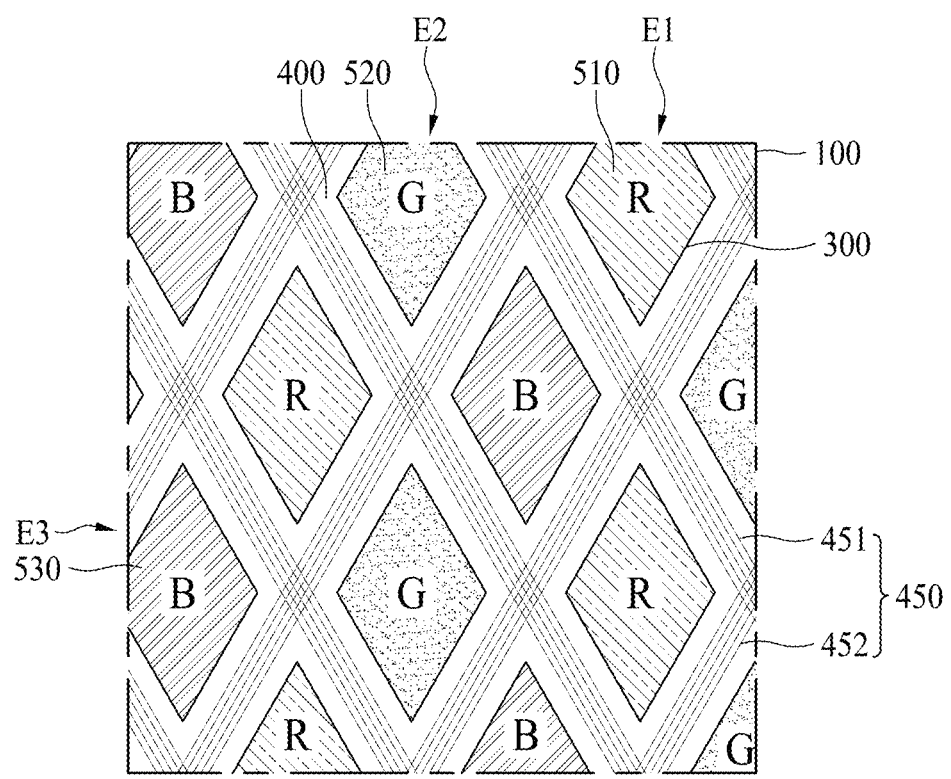

FIGS. 6 to 8 are schematic plan views of electroluminescence display apparatuses according to various examples of the present disclosure.

Each of the electroluminescence display apparatuses illustrated in FIGS. 6 to 8 may be implemented by modifying a structure of the light emitting layers 510, 520, and 530 and a structure of each of the first electrode 300, the bank 400, and the anti-spread part 450 in the electroluminescence display apparatus illustrated in FIG. 4. Hereinafter, therefore, only different elements will be described.

As seen in FIG. 6, a first light emitting layer 510 and a second light emitting layer 520 may face one another in a direction (i.e., a widthwise direction) vertical (or perpendicular) to an extension direction (i.e., a lengthwise direction) of the columns C1 and C2. In detail, the first light emitting layer 510 and the second light emitting layer 520 may be respectively provided on one side (for example, a left side) and another side (for example, a right side) in the columns C1 and C2. A third light emitting layer 530 may be provided under the first light emitting layer 510 and the second light emitting layer 520. In this case, the third light emitting layer 530 may be perpendicularly oriented relative to the first light emitting layer 510 and the second light emitting layer 520, i.e. so as to be positioned alongside to both the first light emitting layer 510 and the second light emitting layer 520. Therefore, an area of the third light emitting layer 530 may be greater than that of each of the first light emitting layer 510 and the second light emitting layer 520. Generally, since an emission efficiency of blue (B) is lower than that of each of red (R) and green (G), the third light emitting layer 530 may be provided to emit blue light. A combination of the first to third light emitting layers 510 to 530 based on such a structure may be repeated in the columns C1 and C2.

A first emission area E1, a second emission area E2, and a third emission area E3 may respectively correspond to the first light emitting layer 510, the second light emitting layer 520, and the third light emitting layer 530. Therefore, a structure of a bank 400 provided between the first to third emission areas E1 to E3 may differ from the structure described above with reference to FIG. 4, and a structure of a first electrode 300 provided in each of the first to third emission areas E1 to E3 may differ from the structure described above with reference to FIG. 4. In detail, an area of the first electrode 300 provided in the third emission area E3 may be greater than that of the first electrode 300 provided in the first emission area E1 and that of the first electrode 300 provided in the second emission area E2.

In FIG. 6, the first to third light emitting layers 510 to 530 which emit lights of different colors may be arranged in the same column C1 or C2. Therefore, an anti-spread part 450 may be provided between adjacent light emitting layers of the first to third light emitting layers 510 to 530 in the same column C1 or C2. In detail, a first anti-spread part 451 may be provided between the first light emitting layer 510 and the second light emitting layer 520 in the same column C1 or C2 in a lengthwise direction parallel to an extension direction of the column C1 or C2, and a second anti-spread part 452 may be provided between the third light emitting layer 530 and the first light emitting layer 510 and between the third light emitting layer 530 and the second light emitting layer 520 in the same column C1 or C2 in a widthwise direction intersecting the extension direction of the column C1 or C2. The first anti-spread part 451 and the second anti-spread part 452 may be provided to intersect each other, and thus, the first to third light emitting layers 510 to 530 may not be mixed with one another in the first to third emission areas E1 to E3 in the same column C1 or C2.

Moreover, a third anti-spread part 453 may be provided between the columns (for example, first and second columns) C1 and C2 in the lengthwise direction parallel to the extension direction of each of the columns C1 and C2. Since the second light emitting layer 520 provided in the first column C1 faces the first light emitting layer 510 provided in the second column C2, the third anti-spread part 453 may be provided, and thus, the second light emitting layer 520 provided in the first column C1 and the first light emitting layer 510 provided in the second column C2 may not be mixed with each other in the first and second emission areas E1 and E2. In this case, when the third anti-spread part 453 is provided to intersect the second anti-spread part 452, the spreading of the first to third light emitting layers 510 to 530 between the first column C1 and the second column C2 is more effectively prevented.

Moreover, the third light emitting layer 530 provided in the first column C1 may be provided alongside, or in-line with, the third light emitting layer 530 provided in the second column C2. Even when the third light emitting layer 530 provided in the first column C1 and the third light emitting layer 530 provided in the second column C2 are mixed with each other in the third emission area E3, image quality is not degraded, and thus, the third anti-spread part 453 may not be provided in a region between the third light emitting layer 530 provided in the first column C1 and the third light emitting layer 530 provided in the second column C2. That is, the third anti-spread part 453 may be provided in a discontinuous structure between the first column C1 and the second column C2 in the lengthwise direction parallel to the extension direction of each of the columns C1 and C2.

A structure of a second column C2 illustrated in FIG. 7 differs from the structure described above with reference to FIG. 6. Hereinafter, therefore, only different elements will be described.

Referring to FIG. 7, in a first column C1, a first light emitting layer 510 may be provided on a left side, and a second light emitting layer 520 may be provided on a right side. On the other hand, in a second column C2, a first light emitting layer 510 may be provided on a right side, and a second light emitting layer 520 may be provided on a left side.

Therefore, the second light emitting layer 520 of the first column C1 may face the second light emitting layer 520 of the second column C2, and a third light emitting layer 530 of the first column C1 may face a third light emitting layer 530 of the second column C2. Accordingly, the third anti-spread part 453 described above with reference to FIG. 6 may not be provided between the first column C1 and the second column C2 in FIG. 7. However, in the example of FIG. 7, the third anti-spread part 453 described above with reference to FIG. 6 may be provided between the first column C1 and the second column C2.

Referring to FIG. 8, a plurality of emission areas E1 to E3, a plurality of light emitting layers 510, 520, and 530, and a first electrode 300 may be provided in a diamond structure. Therefore, a bank 400 may be provided between the plurality of emission areas E1 to E3 to have an inclined matrix structure, and an anti-spread part 450 on an upper surface of the bank 400 may include a first anti-spread part 451 inclined in a first direction and a second anti-spread part 452 inclined in a second direction intersecting the first direction. The first anti-spread part 451 may be provided to intersect the second anti-spread part 452, and thus, the light emitting layers 510, 520, and 530 adjacent to one another are prevented from being mixed with one another in the emission areas E1 to E3.

Although not shown, the electroluminescence display apparatus according to the present disclosure may include a plurality of emission areas E1 to E3, a plurality of light emitting layers 510, 520, and 530, a first electrode 300, and a bank 400 having various structures known to those skilled in the art, in addition to the elements illustrated in FIGS. 6 to 8, and thus, an anti-spread part 450 having various structures may be provided on an upper surface of the bank 400 and between the light emitting layers 510, 520, and 530 which emit lights of different colors.

Figure 9:
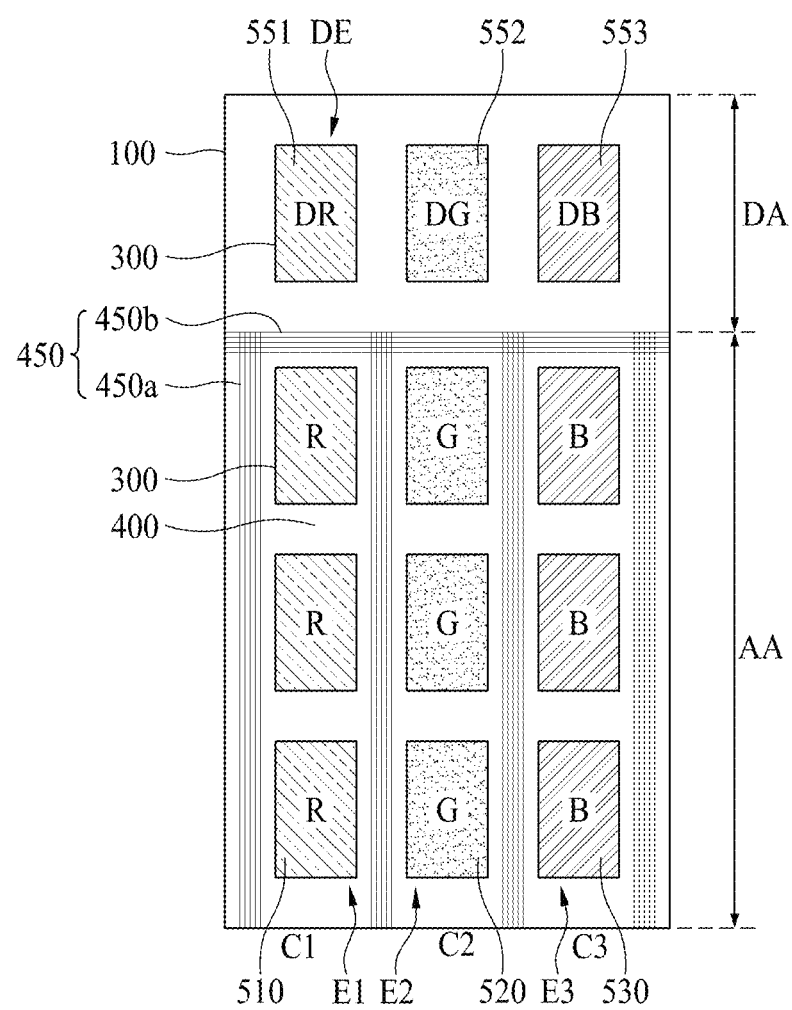
FIG. 9 is a schematic plan view of an electroluminescence display apparatus according to another example of the present disclosure.

FIG. 9 is a schematic plan view of an electroluminescence display apparatus according to another example of the present disclosure and relates to an electroluminescence display apparatus including an active area AA and a dummy area DA.

Referring to FIG. 9, an active area AA and a dummy area DA may be provided on a substrate 100.

The active area AA may function as a display area which displays an image. In the active area AA, a first electrode 300 and a plurality of light emitting layers 510, 520, and 530 may be provided in each of a plurality of emission areas E1 to E3, and a bank 400 may be provided between the plurality of emission areas E1 to E3. Also, in the active area AA, a circuit element layer may be provided between the substrate 100 and the first electrode 300, and a second electrode may be provided on the plurality of light emitting layers 510, 520, and 530. A configuration of the active area AA may be variously modified as in FIGS. 2 to 8.

The dummy area DA may be provided outside the active area AA. In the dummy area DA, a plurality of dummy sub-areas DE may be defined by the bank 400, and a plurality of dummy layers 551 to 553 and the first electrode 300 may be provided in the plurality of dummy sub-areas DE. In the dummy area DA, like the active area AA, the circuit element layer may be provided between the substrate 100 and the first electrode 300, and the second electrode may be provided on the plurality of dummy layers 551 to 553.

The dummy area DA may enable uniform light to be emitted in the active area AA. In detail, a difference between a drying speed at which the light emitting layers 510, 520, and 530 in a center region of the active area AA are dried and a drying speed at which the light emitting layers 510, 520, and 530 in an edge region of the active area AA are dried may occur, and in this case, since a profile of each of the light emitting layers 510, 520, and 530 in the center region of the active area AA and a profile of each of the light emitting layers 510, 520, and 530 in the edge region of the active area AA are not uniform, light may not be uniformly emitted between the center region and the edge region of the active area AA. Therefore, in another example of the present disclosure, since the dummy area DA is provided outside the active area AA and the dummy layers 551 to 553 are provided in the dummy area DA, a uniform profile may be obtained between the light emitting layers 510, 520, and 530 in the active area AA even when a profile is not uniform between the dummy layers 551 to 553 provided in the dummy area DA and the light emitting layers 510, 520, and 530 provided in the active area AA.

Since the dummy area DA is not the display area which displays an image, light is not emitted in the dummy area DA. However, when light is emitted in the dummy area DA, the display quality of the electroluminescence display apparatus is degraded due to leakage light occurring in the dummy area DA.

In order for light to not be emitted in the dummy area DA, a configuration of the dummy area DA may differ from that of the active area AA. For example, at least one of a signal line, a TFT, and a light emitting device may not be provided or may be unstably provided in the circuit element layer provided in the dummy area DA, and thus, light may not be emitted in the dummy area DA. Also, at least one of the first electrode 300 and the second electrode may not be provided in the dummy area DA, and thus, light may not be emitted in the dummy area DA.

The dummy layers 551 to 553 may include a first dummy layer 551, a second dummy layer 552, and a third dummy layer 553.

A plurality of first light emitting layers 510 of a first column C1 provided in the active area AA and the first dummy layer 551 may be arranged in one row, and a plurality of second light emitting layers 520 of a second column C2 provided in the active area AA and the second dummy layer 552 may be arranged in one row. Also, a plurality of third light emitting layers 530 of a third column C3 provided in the active area AA and the third dummy layer 553 may be arranged in one row.

The first dummy layer 551, like the first light emitting layers 510, may be formed of a light emitting layer which emits red light, but as described above, may not actually emit light. The second dummy layer 552, like the second light emitting layers 520, may be formed of a light emitting layer which emits green light, but as described above, may not actually emit light. The third dummy layer 553, like the third light emitting layers 530, may be formed of a light emitting layer which emits blue light, but as described above, may not actually emit light. In FIG. 9, in terms of non-emission of light as described above, DR refers to the first dummy layer 551, DG refers to the second dummy layer 552, and DB refers to the third dummy layer 553.

The bank 400 may be provided in a matrix structure to define the emission areas E1 to E3 in the active area AA and to define the dummy sub-areas DE in the dummy area DA. Also, an anti-spread part 450 may be included in an upper surface of the bank 400.

In this case, as in FIG. 4, the anti-spread part 450 may be provided between the first to third columns C1 to C3 in the active area AA. That is, the anti-spread part 450 may include an anti-spread part 450a provided in the active area AA. When the active area AA is modified as in FIGS. 6 to 8, a structure of the anti-spread part 450a provided in the active area AA may be modified based on the modification of the active area AA.

The anti-spread part 450 may be further provided between the active area AA and the dummy area DA. That is, the anti-spread part 450 may include an anti-spread part 450b which extends from the upper surface of the bank 400 along a boundary surface between the active area AA and the dummy area DA. Therefore, the anti-spread part 450b prevents the dummy layers 551 to 553 provided in the dummy area DA from spreading to the emission areas E1 to E2 provided in the active area AA.

The anti-spread part 450 may not be provided in the dummy area DA. Since light is not emitted in the dummy area DA, image quality is not affected even when the dummy layers 551 to 553 are mixed with one another in an adjacent dummy sub-area DE in the dummy area DA.

Figure 10:
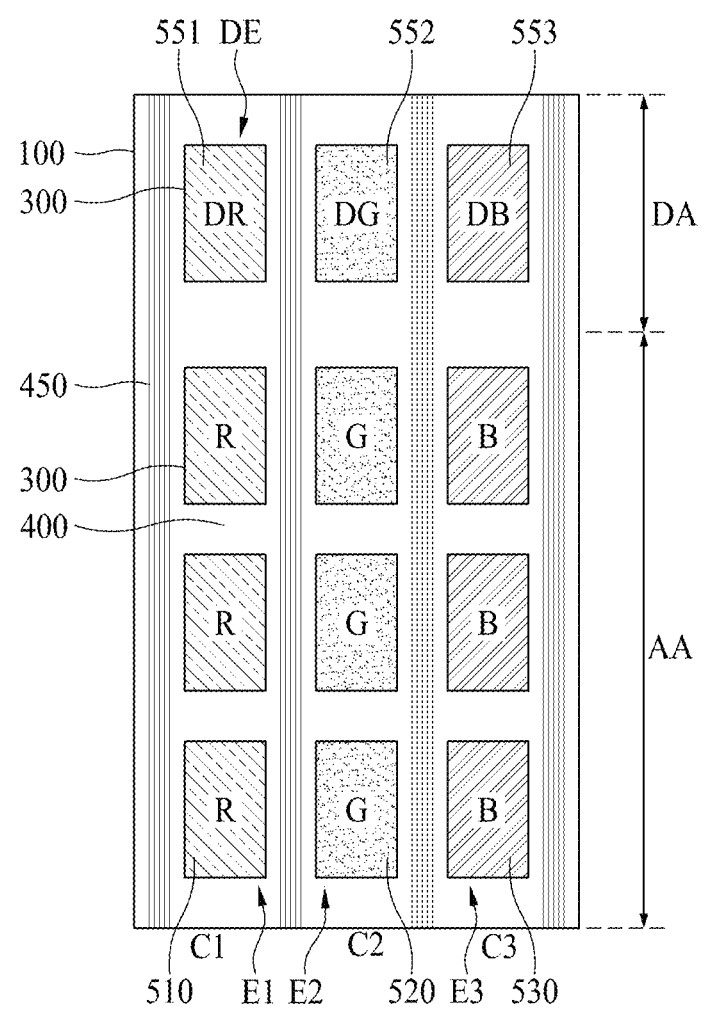
FIG. 10 is a schematic plan view of an electroluminescence display apparatus according to another example of the present disclosure.

FIG. 10 is a schematic plan view of an electroluminescence display apparatus according to another example of the present disclosure. Except for that a configuration of an anti-spread part 450 is modified, the electroluminescence display apparatus of FIG. 10 is the same as the electroluminescence display apparatus of FIG. 9. Hereinafter, therefore, only different elements will be described.

Referring to FIG. 10, an anti-spread part 450 may be provided in a continuous structure between a plurality of columns C1 to C3 in an extension direction of each of the columns C1 to C3 in a whole active area AA and a whole dummy area DA.

A first dummy layer 551 provided in the dummy area DA may be formed of the same material as that of a first light emitting layer 510 provided in the active area AA, and thus, image quality is not degraded even when the first dummy layer 551 spreads to a first emission area E1 and are mixed with the first light emitting layer 510. Also, a second dummy layer 552 provided in the dummy area DA may be formed of the same material as that of a second light emitting layer 520 provided in the active area AA, and thus, image quality is not degraded even when the second dummy layer 552 spreads to a second emission area E2 and are mixed with the second light emitting layer 520. Also, a third dummy layer 553 provided in the dummy area DA may be formed of the same material as that of a third light emitting layer 530 provided in the active area AA, and thus, image quality is not degraded even when the third dummy layer 553 spreads to a third emission area E3 and are mixed with the third light emitting layer 530.

For this reason, as in FIG. 10, a separate anti-spread part 450 may not be provided between the active area AA and the dummy area DA. However, for example, when the second dummy layer 552 spreads to the first emission area E1 or the third emission area E3 in the active area AA, image quality is degraded, and thus, the anti-spread part 450 may be provided between the first to third dummy layers 551 to 553.

Therefore, the anti-spread part 450 may extend continuously from the active area AA to the dummy area DA and may extend from an upper surface of a bank 400 along a boundary surface between a plurality of first dummy layers 551 and a plurality of second dummy layers 552, and moreover, may extend continuously from the active area AA to the dummy area DA and may extend from the upper surface of the bank 400 along a boundary surface between the plurality of second dummy layers 552 and a plurality of third dummy layers 553.

As described above, according to the examples of the present disclosure, the anti-spread part may be provided on the upper surface of the bank, and thus, even when the light emitting layers respectively provided in the plurality of emission areas are discharged in a solution state and flow to the upper surface of the bank, the light emitting layer provided in one emission area is prevented from spreading to the light emitting layer provided in another emission area adjacent thereto.

It will be apparent to those skilled in the art that various modifications and variations can be made in the electroluminescence display apparatus of the present disclosure without departing from the technical idea or scope of the disclosure. Thus, it is intended that the present disclosure cover the modifications and variations of this disclosure provided they come within the scope of the appended claims and their equivalents.

Also disclosed herein are the following numbered clauses.

Clause A1. An electroluminescence display apparatus comprising:
a substrate;
a bank provided to define a plurality of emission areas on the substrate; and
a first light emitting layer and a second light emitting layer individually provided in the plurality of emission areas to emit lights of different colors,
wherein an anti-spread part is provided on an upper surface of the bank disposed between the first light emitting layer and the second light emitting layer.

Clause A2. The electroluminescence display apparatus of clause A1, wherein the anti-spread part extends in a first direction along a boundary surface between the first light emitting layer and the second light emitting layer.

Clause A3. The electroluminescence display apparatus of clause A2, wherein
the anti-spread part comprises a plurality of grooves extending in the first direction, and
the plurality of grooves are spaced apart from one another in a second direction vertical to the first direction.

Clause A4. The electroluminescence display apparatus of clause A3, wherein some of the plurality of grooves are discontinuously provided in the first direction.

Clause A5. The electroluminescence display apparatus of clause A3 or A4, further comprising an electrode provided on the first light emitting layer, the second light emitting layer, and the bank,
wherein a lower surface of the electrode is filled into at least some of the plurality of grooves.

Clause A6. The electroluminescence display apparatus of any of clauses A3 to A5, further comprising a third light emitting layer individually provided in the plurality of emission areas to emit light of a color which differs from the colors of the lights emitted from the first light emitting layer and the second light emitting layer, wherein the anti-spread part comprises:

a first anti-spread part extending in the first direction along a boundary surface between the first light emitting layer and the second light emitting layer; and a second anti-spread part extending in the second direction along a boundary surface between the second light emitting layer and the third light emitting layer, and the first anti-spread part intersects the second anti-spread part.

Clause A7. The electroluminescence display apparatus of any preceding clause, wherein a height of the first light emitting layer at a center of each of the plurality of emission areas is lower than a height of the first light emitting layer at an end of a corresponding emission area, the bank comprises a first bank and a second bank provided on the first bank, and the second bank is provided to have a width which is narrower than a width of the first bank and a thickness which is thicker than a thickness of the first bank.

Clause A8. An electroluminescence display apparatus comprising:

a substrate;

a bank provided to define a plurality of first emission areas, a plurality of second emission areas, and a plurality of third emission areas on the substrate;

a plurality of first light emitting layers respectively provided in the plurality of first emission areas;

a plurality of second light emitting layers respectively provided in the plurality of second emission areas;

a plurality of third light emitting layers respectively provided in the plurality of third emission areas;

a first anti-spread part extending on an upper surface of the bank along a boundary surface between the plurality of first light emitting layers and the plurality of second light emitting layers; and a second anti-spread part extending on the upper surface of the bank along a boundary surface between the plurality of second light emitting layers and the plurality of third light emitting layers.

Clause A9. The electroluminescence display apparatus of clause A8, wherein the first anti-spread part and the second anti-spread part extend in the same direction.

Clause A10. The electroluminescence display apparatus of clause A8, wherein the first anti-spread part and the second anti-spread part extend in different directions and intersect each other.

Clause A11. The electroluminescence display apparatus of any of clauses A8 to A10, wherein the first anti-spread part comprises a plurality of grooves extending in the same direction, and the plurality of grooves are spaced apart from one another in a direction vertical to the direction in which the plurality of grooves extend.

Clause A12. The electroluminescence display apparatus of clause A11, wherein some of the plurality of grooves are discontinuously provided in the direction in which the plurality of grooves extend.

Clause A13. An electroluminescence display apparatus comprising:

a substrate including an active area and a dummy area provided outside the active area;

a bank defining a plurality of emission areas in the active area on the substrate and defining a plurality of dummy sub-areas in the dummy area on the substrate;

a plurality of first light emitting layers and a plurality of second light emitting layers individually provided in the plurality of emission areas;

a plurality of first dummy layers and a plurality of second dummy layers individually provided in the plurality of dummy sub-areas; and an anti-spread part extending on an upper surface of the bank along a boundary surface between the plurality of first light emitting layers and the plurality of second light emitting layers.

Clause A14. The electroluminescence display apparatus of clause A13, wherein the anti-spread part extends from the active area to the dummy area and additionally extends from the upper surface of the bank along a boundary surface between the plurality of first dummy layers and the plurality of second dummy layers.

Clause A15. The electroluminescence display apparatus of clause A13 or A14, further comprising an additional anti-spread part extending on the upper surface of the bank along a (the) boundary surface between the active area and the dummy area, wherein the anti-spread part intersects the additional anti-spread part.

Clause A16. The electroluminescence display apparatus of any of clauses A13 to A15, wherein the anti-spread part comprises a plurality of grooves extending in the same direction, and the plurality of grooves are spaced apart from one another in a direction vertical to the direction in which the plurality of grooves extend.

Clause A17. The electroluminescence display apparatus of clause A16, wherein some of the plurality of grooves are discontinuously provided in the direction in which the plurality of grooves extend.

Clause B1. An electroluminescence display apparatus comprising:

a substrate;

a bank provided to define a plurality of first emission areas, a plurality of second emission areas, and a plurality of third emission areas on the substrate;

a first light emitting layer provided in each of the plurality of first emission areas;

a second light emitting layer provided in each of the plurality of second emission areas;

a third light emitting layer provided in each of the plurality of third emission areas;

wherein an anti-spread part is provided on an upper surface of the bank and comprises:

a first anti-spread part extending on the upper surface of the bank along a first boundary surface between the plurality of first light emitting layers and the plurality of second light emitting layers; and a second anti-spread part extending on the upper surface of the bank along a second boundary surface between the plurality of second light emitting layers and the plurality of third light emitting layers.

Clause B2. The electroluminescence display apparatus of clause B1, wherein the first anti-spread part and the second anti-spread part extend in the same direction.

Clause B3. The electroluminescence display apparatus of clause B1, wherein the first anti-spread part and the second anti-spread part extend in different directions and intersect each other.

Clause B4. The electroluminescence display apparatus of any of clauses B1 to B3, wherein the first anti-spread part comprises a plurality of grooves extending in the same direction, and the plurality of grooves are spaced apart from one another in a direction perpendicular to the direction in which the plurality of grooves extend.

Clause B5. The electroluminescence display apparatus of clause B4, wherein some of the plurality of grooves are discontinuously provided in the direction in which the plurality of grooves extend.

Clause C1. An electroluminescence display apparatus comprising:
a substrate including an active area, and a dummy area provided outside the active area;
a bank provided to define a plurality of emission areas in the active area on the substrate, and a plurality of dummy sub-areas in the dummy area on the substrate, the plurality of emission areas comprising a plurality of first emission areas and a plurality of second emission areas;
a first light emitting layer provided in each of the plurality of first emission areas, and a second light emitting layer provided in each of the plurality of second emission areas; and
a plurality of first dummy layers and a plurality of second dummy layers individually provided in the plurality of dummy sub-areas;
wherein an anti-spread part extends on an upper surface of the bank along a boundary surface between the plurality of first light emitting layers and the plurality of second light emitting layers.

Clause C2. The electroluminescence display apparatus of clause C1, wherein the anti-spread part extends from the active area to the dummy area and additionally extends from the upper surface of the bank along a boundary surface between the plurality of first dummy layers and the plurality of second dummy layers.

Clause C3. The electroluminescence display apparatus of clause C1 or C2, further comprising an additional anti-spread part extending on the upper surface of the bank along a boundary surface between the active area and the dummy area,
wherein the anti-spread part intersects the additional anti-spread part.

Clause C4. The electroluminescence display apparatus of any of clauses C1 to C3, wherein
the anti-spread part comprises a plurality of grooves extending in the same direction, and
the plurality of grooves are spaced apart from one another in a direction perpendicular to the direction in which the plurality of grooves extend.

Clause C5. The electroluminescence display apparatus of clause C4, wherein some of the plurality of grooves are discontinuously provided in the direction in which the plurality of grooves extend.

What is claimed is:

1. An electroluminescence display apparatus, comprising:
a substrate including an active area and a dummy area;
a bank provided to define a plurality of emission areas on the substrate;
a first light emitting layer provided in a first emission area of the plurality of emission areas, and a second light emitting layer provided in a second emission area of the plurality of emission areas; and
a plurality of dummy layers including a first dummy layer and a second dummy layer in the dummy area,
wherein an upper portion of the bank disposed between the first light emitting layer and the second light emitting layer and between the first dummy layer and the second dummy layer comprises an anti-spread part that has a higher hydrophobicity than a lower portion of the bank, and
wherein the anti-spread part linearly extends in a first direction from the active area to the dummy area, and comprises a plurality of grooves extending in the first direction without extending to an area between adjacent two first light emitting layers and an area between the active area and the dummy area;
the bank including a first bank and a second bank on the first bank,
the second bank having a width which is narrower than a width of the first bank and a thickness which is thicker than a thickness of the first bank, and
the second bank including the anti-spread part,
wherein the second bank includes an organic insulating material,
wherein the first bank includes an inorganic insulating material, and
wherein an upper portion of the second bank has a higher hydrophobicity than a lower portion of the second bank, and the first light emitting layer contacts an upper surface of the first bank and the lower portion of the second bank.

2. The electroluminescence display device of claim 1, wherein the hydrophobicity of the anti-spread part is graduated from a higher hydrophobicity at an upper surface of the bank, to a lower hydrophobicity at the lower portion of the bank.

3. The electroluminescence display apparatus of claim 1, wherein the anti-spread part extends in the first direction along a boundary between the first light emitting layer and the second light emitting layer.

4. The electroluminescence display apparatus of claim 3, wherein the plurality of grooves are spaced apart from one another in a second direction along the boundary, the second direction being perpendicular to the first direction.

5. The electroluminescence display apparatus of claim 4, wherein some of the plurality of grooves are discontinuously provided in the first direction.

6. The electroluminescence display apparatus of claim 4, further comprising an electrode provided on the first light emitting layer, the second light emitting layer, and the bank,
wherein a lower surface of the electrode is filled into at least some of the plurality of grooves.

7. The electroluminescence display apparatus of claim 3, further comprising a third light emitting layer individually provided in a third emission area separate from the first and second emission areas, the third light emitting layer configured to emit light of a color which differs from colors emitted from the first light emitting layer and the second light emitting layer,
wherein the boundary comprises a first boundary between the first light emitting layer and the second light emitting layer, and a second boundary between the second light emitting layer and the third light emitting layer, and
the anti-spread part comprises:
a first anti-spread part extending in the first direction along the first boundary; and
a second anti-spread part extending in the second direction along the second boundary, and
the first anti-spread part intersects the second anti-spread part.

8. The electroluminescence display apparatus of claim 1, wherein:
a height (h1) of the first light emitting layer at a center of a corresponding first emission area is lower than a height (h2) of the first light emitting layer at an edge of the corresponding first emission area.

9. The electroluminescence display apparatus of claim 1, wherein:
the plurality of emission areas on the substrate comprises a plurality of first emission areas, a plurality of second emission areas, and a plurality of third emission areas, the apparatus comprising:
a first light emitting layer provided in each of the plurality of first emission areas;
a second light emitting layer provided in each of the plurality of second emission areas;
a third light emitting layer provided in each of the plurality of third emission areas;
wherein the anti-spread part comprises:
a first anti-spread part extending on the upper surface of the bank along a first boundary between the plurality of first light emitting layers and the plurality of second light emitting layers; and
a second anti-spread part extending on the upper surface of the bank along a second boundary between the plurality of second light emitting layers and the plurality of third light emitting layers.

10. The electroluminescence display apparatus of claim 9, wherein the first anti-spread part and the second anti-spread part extend in the same direction, or
wherein the first anti-spread part and the second anti-spread part extend in different directions and intersect each other.

11. The electroluminescence display apparatus of claim 9, wherein:
the first anti-spread part comprises a plurality of grooves extending in the same direction,
the plurality of grooves are spaced apart from one another in a direction perpendicular to the direction in which the plurality of grooves extend; and
wherein some of the plurality of grooves are discontinuously provided in the direction in which the plurality of grooves extend.

12. The electroluminescence display apparatus of claim 1, wherein:
the plurality of emission areas on the substrate are defined in the active area, and the plurality of emission areas comprise a plurality of first emission areas and a plurality of second emission areas;
the bank further defining a plurality of dummy sub-areas in the dummy area on the substrate, the apparatus comprising:
the first light emitting layer provided in each of the plurality of first emission areas, and the second light emitting layer provided in each of the plurality of second emission areas; and
a plurality of first dummy layers and a plurality of second dummy layers individually provided in the plurality of dummy sub-areas,
wherein an upper surface of the bank disposed between the plurality of first light emitting layers and the plurality of second light emitting layers comprises the anti-spread part.

13. The electroluminescence display apparatus of claim 12, wherein the anti-spread part additionally extends from the upper surface of the bank along a boundary between the plurality of first dummy layers and the plurality of second dummy layers.

14. The electroluminescence display apparatus of claim 12, wherein:
the anti-spread part comprises a plurality of grooves extending in the same direction,
the plurality of grooves are spaced apart from one another in a direction perpendicular to the direction in which the plurality of grooves extend, and
some of the plurality of grooves are discontinuously provided in the direction in which the plurality of grooves extend.

15. The electroluminescence display apparatus of claim 1, wherein the first and second light emitting layers are respectfully configured to emit light of different colors.

16. The electroluminescence display apparatus of claim 1, wherein an upper surface of the bank has a higher hydrophobicity than a lower surface of the bank and extends in the first direction along a boundary between the first light emitting layer and the second light emitting layer.

17. The electroluminescence display apparatus of claim 16, wherein the dummy area includes first and second dummy areas provided outside the active area, and the anti-spread part further extends from the upper surface of the bank along a boundary between the first dummy area and the second dummy area.

18. The electroluminescence display apparatus of claim 17, wherein:
the upper surface of the bank comprises a plurality of grooves extending in the first direction, and
the plurality of grooves are spaced apart from one another in a second direction along the boundary, the second direction being perpendicular to the first direction.

19. The electroluminescence display apparatus of claim 18, further comprising an electrode provided on the first light emitting layer, the second light emitting layer, and the bank,
wherein a lower surface of the electrode is filled into at least some of the plurality of grooves.

* * * * *